(12) United States Patent
Covington

(10) Patent No.: US 7,006,375 B2
(45) Date of Patent: Feb. 28, 2006

(54) HYBRID WRITE MECHANISM FOR HIGH SPEED AND HIGH DENSITY MAGNETIC RANDOM ACCESS MEMORY

(75) Inventor: Mark William Covington, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 287 days.

(21) Appl. No.: 10/456,451

(22) Filed: Jun. 6, 2003

(65) Prior Publication Data
US 2004/0246775 A1 Dec. 9, 2004

(51) Int. Cl.
*G11C 11/15* (2006.01)
(52) U.S. Cl. .................. 365/173; 365/158; 365/171
(58) Field of Classification Search ............... 365/173, 365/158, 171
See application file for complete search history.

(56) References Cited

U.S. PATENT DOCUMENTS

| | | | |
|---|---|---|---|
| 5,640,343 A | 6/1997 | Gallagher et al. | |
| 5,695,864 A | 12/1997 | Slonczewski | |
| 5,768,181 A | 6/1998 | Zhu et al. | |
| 6,081,445 A | 6/2000 | Shi et al. | |
| 6,256,223 B1 | 7/2001 | Sun | |
| 6,385,082 B1 | 5/2002 | Abraham et al. | |
| 6,469,926 B1 | 10/2002 | Chen | |
| 2002/0105823 A1 | 8/2002 | Redon et al. | |
| 2002/0105827 A1 | 8/2002 | Redon et al. | |
| 2003/0048658 A1 | 3/2003 | Chen | |
| 2003/0048676 A1 | 3/2003 | Daughton et al. | |

OTHER PUBLICATIONS

J. C. Slonczewski, "Current-Driven Excitation of Magnetic Multilayers," *Journal of Magnetism and Magnetic Materials*. vol. 159, 1996, pp. L1-L7.
J. A. Katine et al., "Current-Driven Magnetization Reversal and Spin-Wave Excitations in Co/Cu/Co Pillars," *Physical Review Letters*, vol. 84, No. 14, Apr. 3, 2000, pp. 3149-3152.

*Primary Examiner*—Anh Phung
*Assistant Examiner*—Hien Nguyen
(74) *Attorney, Agent, or Firm*—Robert P. Lenart, Esq.; Pletragallo, Bosick & Gordon

(57) ABSTRACT

A method of writing to a magnetic random access memory comprising: producing a magnetic field along a magnetically hard axis of a free layer of a magnetoresistive element; and passing current through the magnetoresistive element to change a direction of magnetization of the free layer by spin momentum transfer. A magnetic random access memory that operates in accordance with the method is also included.

20 Claims, 6 Drawing Sheets

HYBRID WRITE MECHANISM FOR HIGH SPEED AND HIGH DENSITY MAGNETIC RANDOM ACCESS MEMORY

FIELD OF THE INVENTION

This invention relates to magnetic random access memory and, more particularly, to a method of writing to magnetic random access memory and magnetic random access memory that can be used to perform the method.

BACKGROUND OF THE INVENTION

Magnetic random access memory (MRAM) is a new technology that will likely provide superior performance over existing flash memory technology and may even supplant disk drives in certain low power applications requiring a compact non-volatile memory device. In MRAM, bits are represented by the magnetic configuration of a small volume of ferromagnetic material and its magnetic state is measured via a magnetoresistive (MR) effect during read-back. The MRAM typically includes a two-dimensional array of cells, with each cell containing one MR element that can store one bit.

Most common MRAM designs employ MR elements that are based on either giant magnetoresistance (GMR) or tunneling magnetoresistance (TMR), where these elements are patterned thin film multilayer structures that include at least one pinned ferromagnetic layer (PL) and one free ferromagnetic layer (FL). These elements are designed so that the FL has a bistable magnetic configuration that is preferentially aligned along one out of a possible two anti-parallel directions. Hence, the binary data are stored as the orientation of the FL magnetization. The PL magnetization is aligned along only one of the two possible FL directions, and its role is to provide a fixed reference so that the magnetoresistance reveals the FL orientation with respect to the PL.

There are numerous ways to implement a device based on this concept. However, the leading method to write bits is a so-called "half-select" process in which the magnetic fields generated by two roughly orthogonal current carrying wires orient the free layer into its intended configuration. All publicly disclosed MRAM prototypes to date have used this method. The amplitudes of the currents flowing through the two wires, referred to as the word and bit lines, are chosen so that the corresponding fields reverse a FL only where the two wires intersect. Therefore, this method can select any individual cell within the array with a minimum of electrical wires and without unintentionally reversing the magnetic state of other cells.

Although MRAM has yet to reach the commercial market, it is likely that at least the first generation of products will employ a half-select write process. Unfortunately, this writing scheme exhibits poor scaling with increasing areal density of cells. MRAM faces the same issue of thermal stability that is confronting hard disk drives. In order to preserve the stability of the bits, the magnetic anisotropy of the FL will necessarily have to increase whenever the dimensions of the MR element decrease. This means that higher density MRAM will require larger magnetic fields in order to write bits, which will require larger currents through the word and bit lines that will consume more power. One way to improve the writing efficiency is to employ a thermally assisted writing scheme that reduces the FL anisotropy by heating the MR element. However, this write process will have to overcome numerous reliability issues related to the large increases in temperature required to make this scheme work. Thermally assisted writing will also face significant challenges in producing competitive writing speeds, as the process is fundamentally limited by the time (~1 ns) it takes for thermal energy to transfer from the lattice (phonons) to the magnetic system.

Another way to improve the writing efficiency of high density MRAM is to set the FL magnetization using the torque from an effect referred to as spin momentum transfer, as has been proposed in certain patents. Spin transfer is a phenomenon that occurs in current perpendicular to the plane (CPP) GMR devices that have cross-sectional areas on the order to $10^4$ nm$^2$ or less. The strength of the torque is directly proportional to the current density through the CPP pillar. Therefore, for a given current, the current density will increase as the area of the CPP pillar decreases in size, and spin transfer will become more efficient as the density of MRAM increases. However, even a write process based on spin momentum transfer will have to confront the increasingly burdensome requirement of having to reverse the magnetization of a FL having a larger anisotropy. Furthermore, initial predictions indicate that a write process based on spin transfer alone can be slower at reversing the FL magnetization than writing with a conventional magnetic field.

There is a need for a MRAM that can overcome the deficiencies of previous MRAM devices.

SUMMARY OF THE INVENTION

A method of writing to a magnetic random access memory comprising: producing a magnetic field along a magnetically hard axis of a free layer of a magnetoresistive element; and passing current through the magnetoresistive element to change a direction of magnetization of the free layer by spin momentum transfer.

The magnetic field along the magnetically hard axis of a free layer of a magnetoresistive element can be produced by passing a current through one or more conductors located adjacent to the magnetoresistive element.

A single conductor can serve as the means for producing a magnetic field along a magnetically hard axis of a free layer of a magnetoresistive element and a connection for supplying current to the magnetoresistive element.

The magnetic field along the magnetically hard axis of a free layer of a magnetoresistive element can cause the magnetization of the free layer to precess around an equilibrium direction, and the current through the magnetoresistive element can be applied at times when the magnetization of the free layer overshoots the equilibrium direction.

In another aspect, the invention encompasses a magnetic random access memory comprising means for producing a magnetic field along a magnetically hard axis of a free layer of a magnetoresistive element, and means for passing current through the magnetoresistive element to change a direction of magnetization of the free layer by spin momentum transfer.

The magnetoresistive element can comprise a pinned layer and a nonmagnetic layer positioned between the free layer and the pinned layer. A nano-oxide layer can be positioned in either the free layer, the pinned layer, or both the free layer and a pinned layer.

The magnetoresistive element can alternatively comprise a first pinned layer; a first nonmagnetic layer positioned between the free layer and the pinned layer; a second pinned layer; and a second nonmagnetic layer positioned between the free layer and the pinned layer.

DETAILED DESCRIPTION OF THE INVENTION

Figure 1:
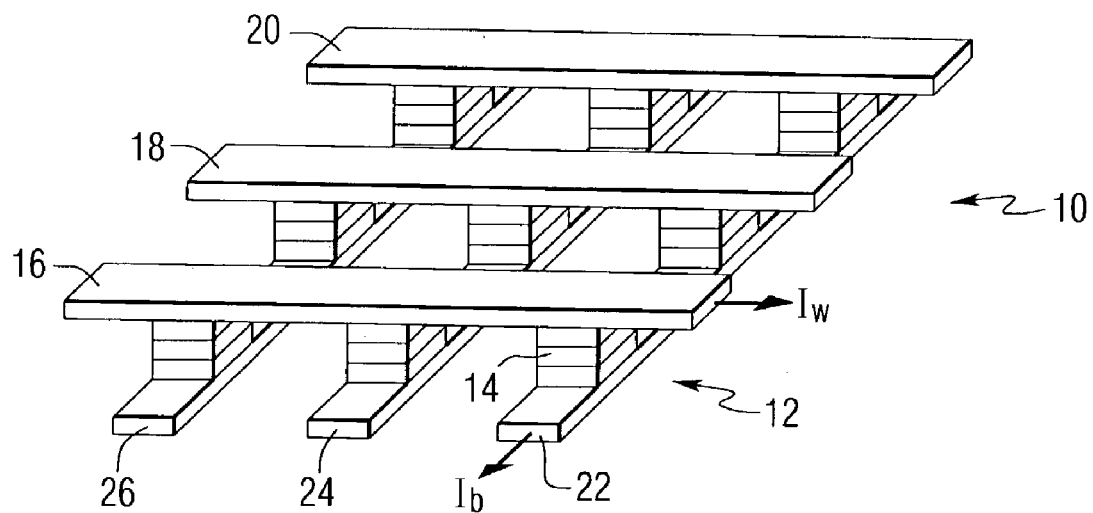
FIG. 1 is a schematic representation of a prior art MRAM.

Referring to the drawings, FIG. 1 is a schematic representation of a conventional magnetic random access memory 10. MRAM 10 includes a 3×3 array of cells 12 that are a subset of the total number of cells comprising the MRAM device. Every cell contains one MR element 14. There are two roughly orthogonal sets of electrical wires, referred to as word lines 16, 18 and 20, and bit lines 22, 24 and 26, that overlap the MR elements. A bit is written only at the intersection of the word and bit lines that have current flowing through them.

Figure 2:
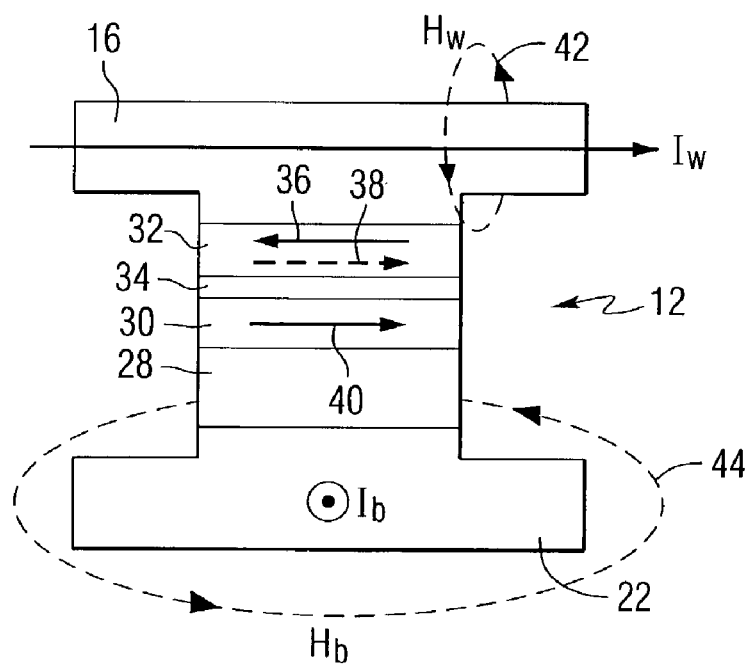
FIG. 2 is a cross-sectional view of a prior art MR element.

FIG. 2 is a cross-sectional view of a MR element 14, which for this particular example is a magnetic tunnel junction. The MR element is connected between a word line 16 and a bit line 22, and includes an antiferromagnetic layer 28, a pinned layer 30 positioned on the antiferromagnetic layer, a free layer 32, and a nonmagnetic layer 34 between the pinned layer and the free layer. The arrows 36 and 38 in the free layer, and arrow 40 in the pinned layer indicate the direction of magnetization. Current passing through the word line produces a field 42 along the hard axis of the free layer. Current passing through the bit line produces a field 44 along the easy axis of the free layer.

Figure 3:
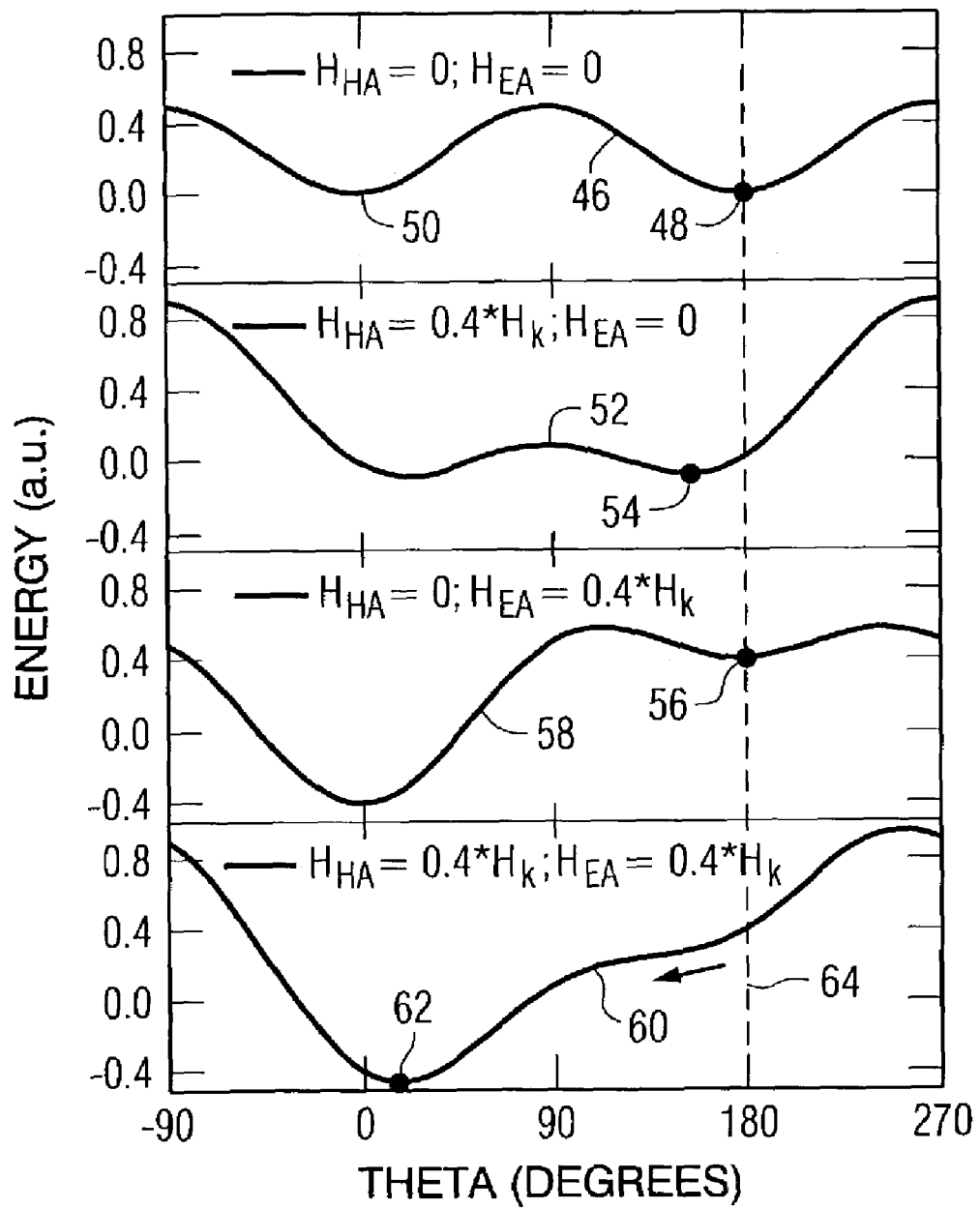
FIG. 3 is a graph of energy versus magnetization angle for a MR element.

The half-select process is further illustrated in FIG. 3. Curve 46 shows the energy versus magnetization angle for a FL in its quiescent state with assumed uniaxial anisotropy. There are two preferred magnetic orientations 48 and 50 as indicated by the minima of curve 46, that correspond to the points of minimum energy. A current passing through the word line produces a field along the hard axis of the FL with an amplitude that is roughly one half of the anisotropy field, $H_K$. Curve 52 shows that this field lowers the energy barrier for magnetization reversal, but the magnetization is still "trapped" in an energy minimum close to its initial state as illustrated by dot 54. A current passing through the bit line produces a field along the easy axis of the FL in a direction that sets the final orientation of the FL magnetization. This field also lowers the energy barrier for magnetization reversal but, as is the case for the hard axis field from the word line, the magnetization stays in the metastable energy minimum 56 around its initial configuration, as shown in curve 58. Only the simultaneous application of these two fields will drive the FL magnetization to a new configuration 180° away from its initial state. Curve 60 illustrates how these fields eliminate the energy barrier, leaving only one energetically preferred state 62 in a direction determined by the direction of the field from the bit line.

FIG. 3 illustrates the "half-select" write mechanism for reversing the magnetization of a single-domain ferromagnetic particle having uniaxial anisotropy. The dashed line 64 indicates a hypothetical initial magnetization direction, and the dots indicate the equilibrium state of the magnetization for all four situations. Curve 46 represents energy as a function of the angle of the magnetization in the absence of an external magnetic field. Curve 52 represents energy when the word line produces a magnetic field equal to $0.4*H_K$ along the hard axis, or 90° direction. Curve 58 represents energy when the bit line produces a field of $0.4*H_K$ along the easy axis, or 0° direction. Curve 60 represents energy when both hard and easy axis fields are applied by the word and bit lines, respectively. This occurs only at the cell where the word and bit lines overlap, and it is the combination of these two fields that drives the magnetization into its new orientation.

Figure 4:
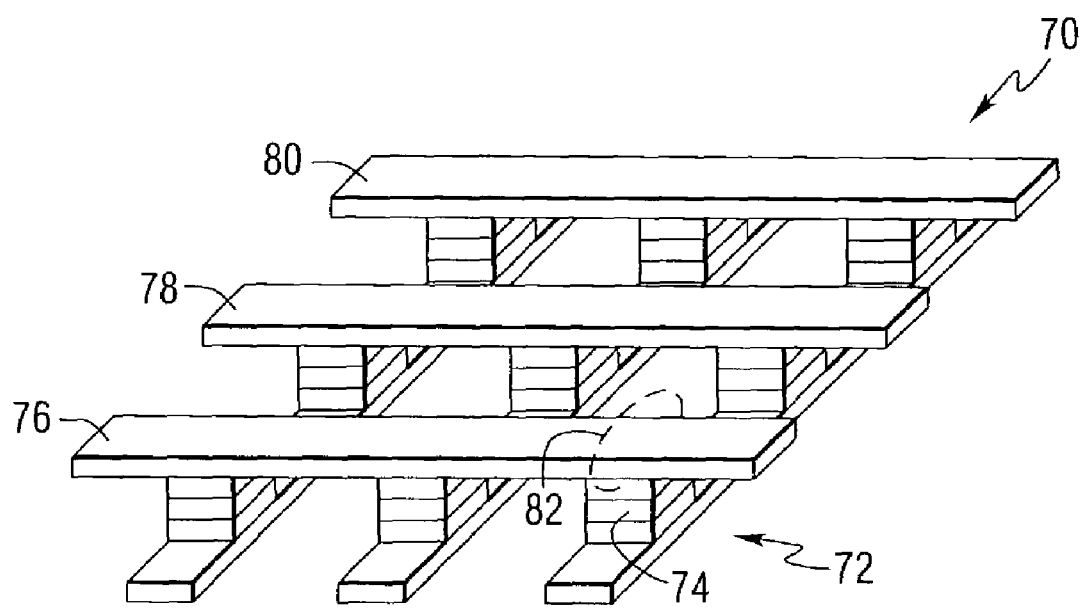
FIG. 4 is a schematic representation of a MRAM constructed in accordance with this invention.

This invention provides a different write process that uses a combination of spin momentum transfer and the conventional magnetic field from a current carrying wire. FIG. 4 is a schematic representation of a MRAM 70 constructed in accordance with this invention. MRAM 70 includes a two-dimensional array of cells 72, each including a MR element 74. Word lines 76, 78 and 80 produce a magnetic field 82 along the hard axis of the MR elements, but the bit lines have been omitted. The bit is written via spin momentum transfer provided by a current perpendicular to the plane (CPP) flowing through the MR elements.

Figure 5:
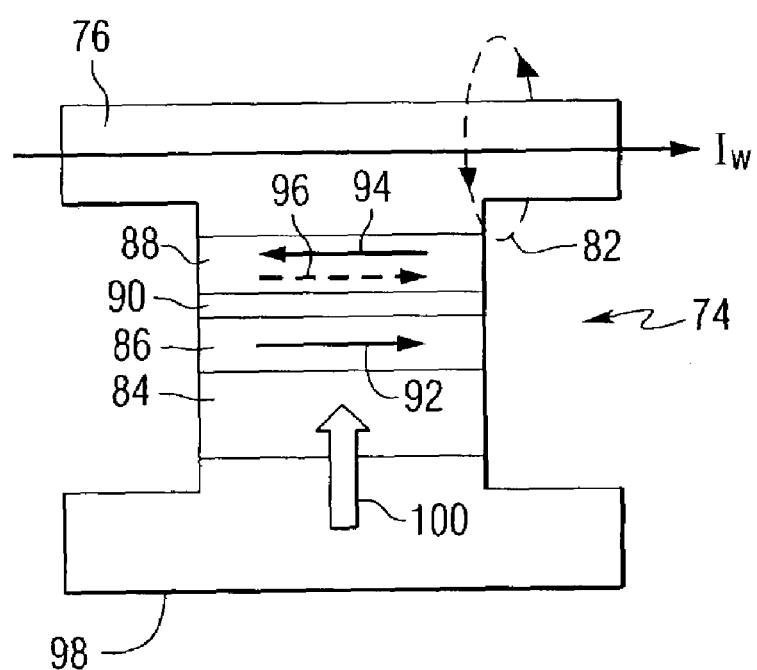
FIG. 5 is a cross-sectional view of a MR element constructed in accordance with this invention.

FIG. 5 is a cross-sectional view of a MR element 74 constructed in accordance with this invention. The MR element includes an antiferromagnetic layer 84, a pinned layer 86 positioned adjacent to the antiferromagnetic layer, a free layer 88, and a nonmagnetic layer 90 positioned between the pinned layer and the free layer. Arrow 92 illustrates the direction of magnetization of the pinned layer. Arrows 94 and 96 illustrate alternative directions of magnetization of the free layer. The MR element in this example is a CPP spin valve. The spin valve is connected between a word line 76 and a contact layer 98. A current source, not shown, is connected to the word line and the contact layer to supply electrical current to the spin valve during the writing process. There is a torque acting on the free layer due to spin transfer whenever a CPP current is driven through the stack as illustrated by arrow 100. The direction of magnetization of the free layer can be set into parallel and anti-parallel configurations with respect to the pinned layer by simply changing the direction of a CPP current of sufficient amplitude to cause switching. The current can be supplied through a suitable arrangement of diodes, transistors, or other components in accordance with known techniques.

Figure 6:
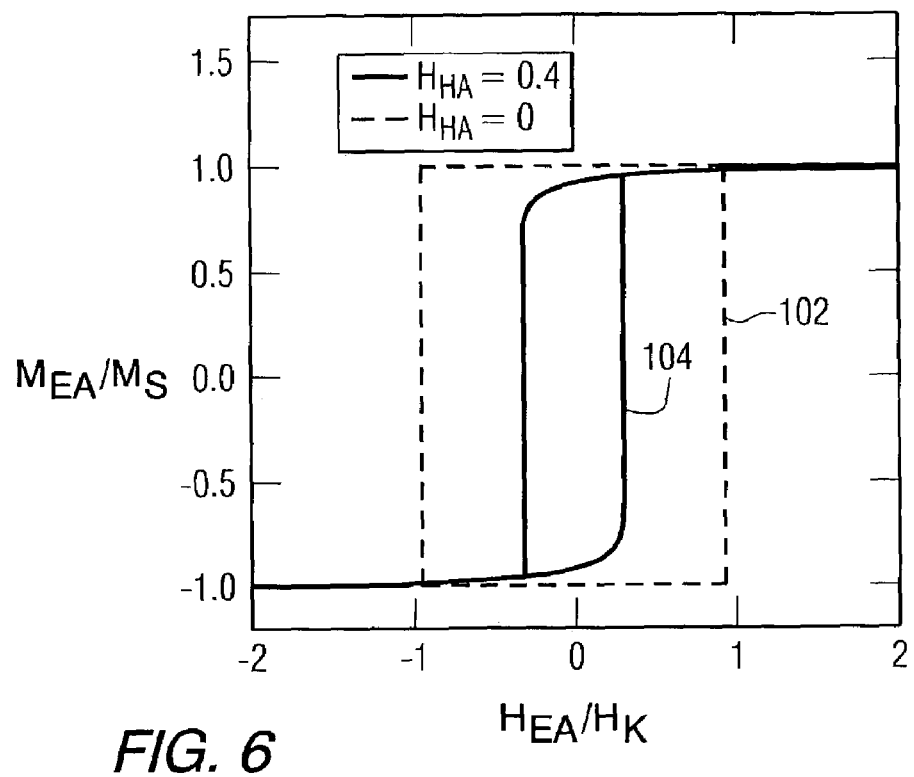
FIG. 6 is a graph of magnetization versus magnetic field for a free layer within a MR element.
Figure 7:
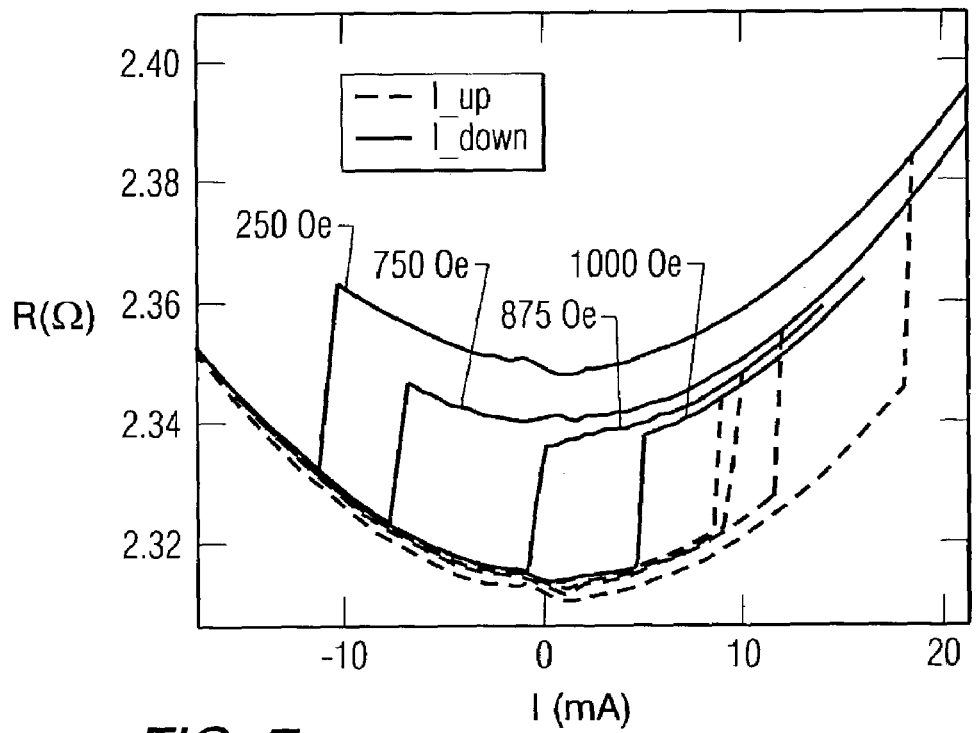
FIG. 7 is a graph of resistance versus current of a MR element.

FIG. 6 is a plot of the magnetization component along the easy axis $M_{EA}$ as a function of easy axis magnetic field $H_{EA}$ for a single-domain ferromagnetic particle having uniaxial anisotropy. With no hard axis field applied, as illustrated by curve 102, the particle switches its orientation by 180° when the easy axis field equals or exceeds the uniaxial anisotropy field, $H_K$. When a hard axis field of $0.4*H_K$ is applied, as illustrated by curve 104, the particle will switch at fields that are much less than $H_K$. FIG. 7 is a plot of actual data from a CPP bottom spin valve having a rectangular cross-sectional area of approximately $10^4$ nm$^2$ and the following layer structure from bottom-to-top: IrMn90/CoFe40/Ru10/CoFe40/Cu22/CoFe30, where the numbers refer to layer thicknesses in Å. The anisotropy field of the free layer is approximately $H_K$~1500 Oe. The curves in FIG. 7 are labeled to indicate the direction the current is being swept and the numbers represent the hard axis bias field.

The CPP current can switch the orientation of the free layer with respect to the pinned layer via spin momentum transfer, as evidenced by abrupt changes in the resistance between the low resistance parallel and high resistance anti-parallel states. In an analogous manner as the field-induced switching shown in FIG. 6, these current switching thresholds decrease with increasing hard axis bias field. Note that the switching thresholds are asymmetric about zero current due to small misalignment of the magnetic field with respect to the hard axis of the device.

Figure 8:
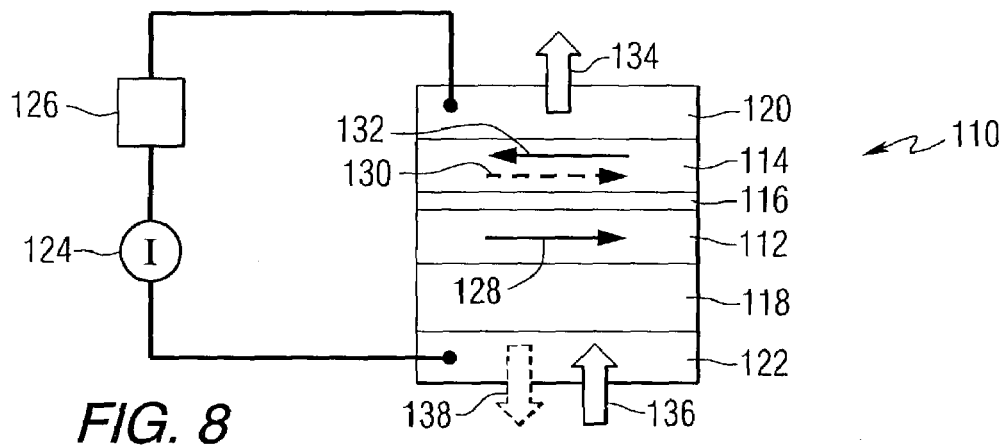
FIGS. 8, 9 and 10 are cross-sectional views of alternative MR elements constructed in accordance with this invention.
Figure 9:
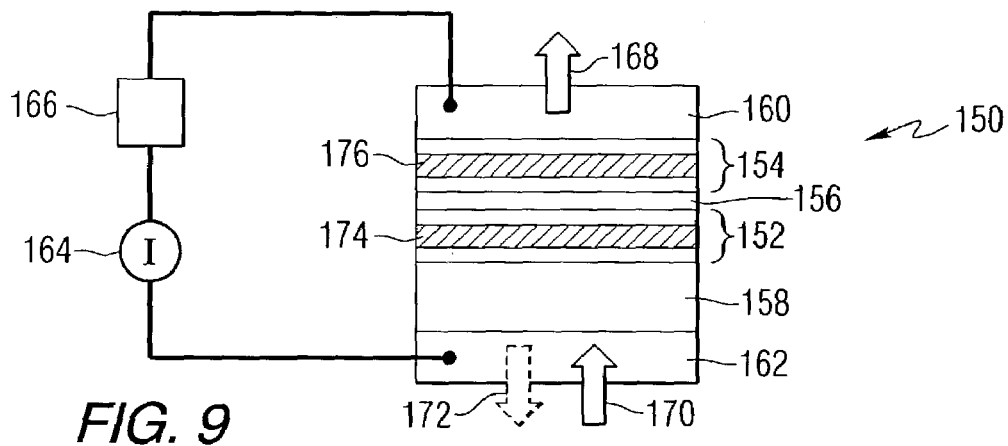
Figure 10:
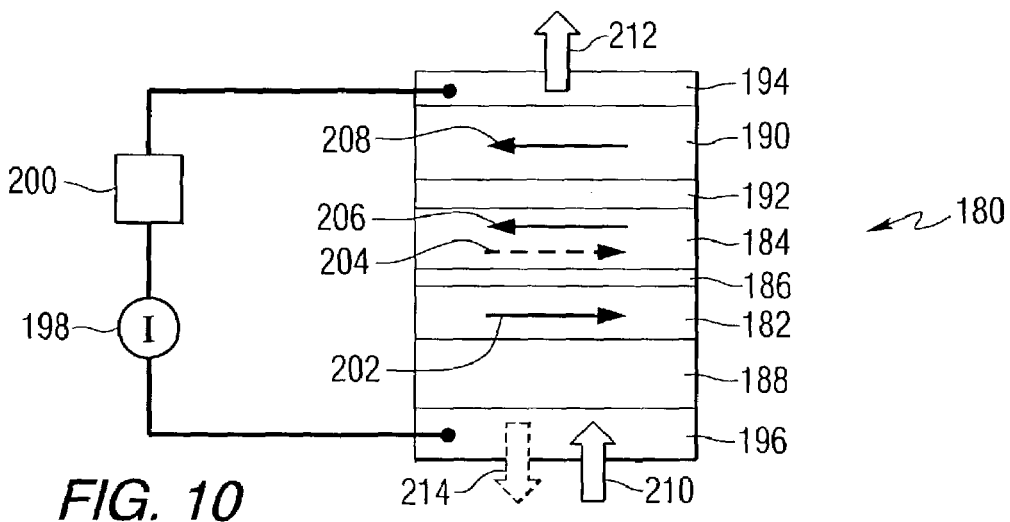

FIGS. 8, 9 and 10 are cross-sectional views of alternative MR elements that can be used in combination with the hybrid write mechanism. FIG. 8 shows a CPP spin valve structure 110 including a pinned layer 112, a free layer 114, and a nonmagnetic layer 116 positioned between the pinned layer and the free layer. An antiferromagnetic layer 118 is positioned adjacent to the pinned layer. First and second contacts, 120 and 122, are provided on opposite sides of the CPP pillar and are connected to a current source 124. Means generally indicated as block 126 can further be provided to connect the current source to the pillar and to produce a signal in response to a change in resistance of the pillar during reading of the element. Arrow 128 illustrates the direction of magnetization of the pinned layer. Arrows 130 and 132 illustrate alternative directions of magnetization of the free layer. Arrows 134 and 136 illustrate the direction of positive conventional electrical current. Arrow 138 illustrates the direction of negative conventional electrical current. In the structure of FIG. 8, spin momentum transfer between the free layer and pinned layer writes the bits, and magnetoresistance between these two layers is used to measure the relative configuration during read-back.

FIG. 9 shows a modification of the CPP spin valve whereby nano-oxide layers are inserted into the thin film multilayer in order to boost the resistance of the device and increase the amplitude of the read-back signal. FIG. 9 shows a CPP spin valve structure 150 including a pinned layer 152, a free layer 154, and a nonmagnetic layer 156 positioned between the pinned layer and the free layer. An antiferromagnetic layer 158 is positioned adjacent to the pinned layer. First and second contacts, 160 and 162, are provided on opposite sides of the CPP pillar and are connected to a current source 164. Means generally indicated as block 166 can further be provided to connect the current source to the pillar and to produce a signal in response to a change in resistance of the pillar during reading of the element. Arrows 168 and 170 illustrate the direction of positive conventional electrical current. Arrow 172 illustrates the direction of negative conventional electrical current. Nano-oxide layers 174 and 176 are shown in layers 154 and 152 respectively. The magnetization directions of the free and pinned layers are aligned along the same directions as in FIG. 8.

FIG. 10 shows a magnetic tunnel junction that has a pinned reference layer and Cu spacer layer adjacent to the free layer. FIG. 10 shows a CPP spin valve structure 180 including a pinned layer 182, a free layer 184, and a nonmagnetic insulating tunnel barrier layer 186 positioned between the pinned layer and the free layer. An antiferromagnetic layer 188 is positioned adjacent to the pinned layer. An additional reference pinned layer 190 is separated from the free layer 184 by a nonmagnetic layer 192. First and second contacts, 194 and 196, are provided on opposite sides of the CPP pillar and are connected to a current source 198. Means generally indicated as block 200 can further be provided to connect the current source to the pillar and to produce a signal in response to a change in resistance of the pillar during reading of the element. Arrow 202 illustrates the direction of magnetization of the pinned layer 182. Arrows 204 and 206 illustrate alternative directions of magnetization of the free layer. Arrow 208 illustrates the direction of magnetization of the reference pinned layer 190. Arrows 210 and 212 illustrate the direction of positive conventional electrical current. Arrow 214 illustrates the direction of negative conventional electrical current. Spin momentum transfer between the free layer and pinned reference layer 190 is used to write bits while the tunneling magnetoresistance between the free layer and pinned layer 182 is used to measure the free layer orientation during read-back.

Figure 11:
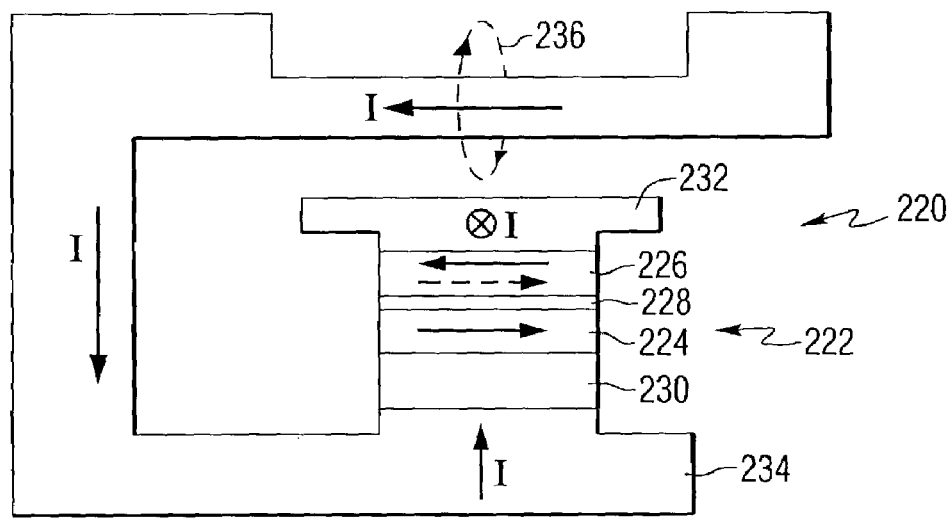
FIG. 11 is a cross-sectional view of a portion of a MRAM constructed in accordance with this invention.
Figure 12:
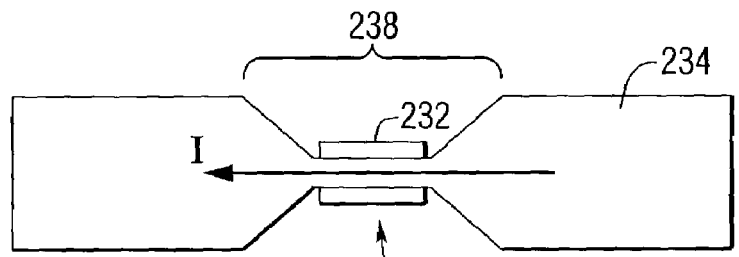
FIG. 12 is a top view of a portion of the MRAM of FIG. 11.

FIG. 11 is a cross-sectional view of a portion of another MRAM 220 constructed in accordance with this invention. FIG. 12 is a top view of a portion of a MRAM of FIG. 11. The magnetoresistive element 222 includes a pinned layer 224, a free layer 226, and a nonmagnetic layer 228 positioned between the pinned layer and the free layer. An antiferromagnetic layer 230 is positioned adjacent to the pinned layer. First and second leads, 232 and 234, are provided on opposite sides of the CPP pillar and are connected to a current source. The leads 232 and 234 to the CPP pillar are configured so that the current flowing in the portion of lead 234 that is above lead 232 produces a magnetic field 236 along the hard axis of the free layer concurrently with a CPP current flowing through the pillar. The electrical leads are insulated from each other and supported by insulating material, which has been omitted from FIGS. 11 and 12 for the sake of clarity. FIG. 12 is a top view of the MR element 222 and electrical lead 234. The electrical lead 234 can be tapered in the region 238 near the element in order to locally boost the current density that will, in turn, produce larger hard axis bias fields.

Figure 13:
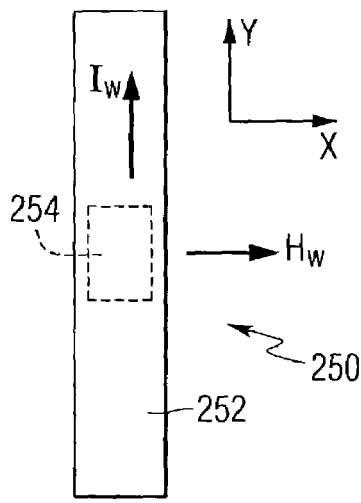
FIG. 13 is a top view of a portion of another MRAM constructed in accordance with this invention.
Figure 14:
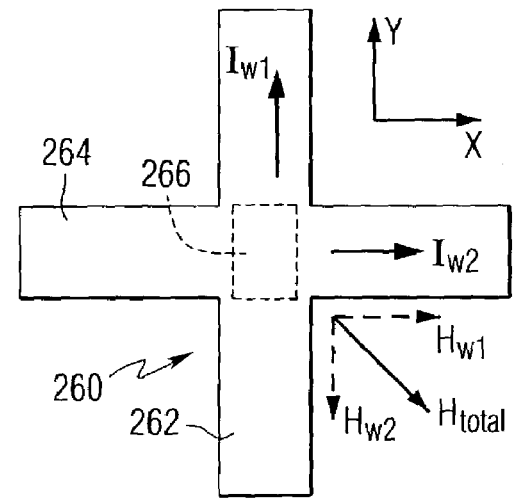
FIG. 14 is a top view of a portion of another MRAM constructed in accordance with this invention.

FIG. 13 is a top view of a portion of another MRAM 250 constructed in accordance with this invention. FIG. 13 shows a current carrying word line 252 that produces a field $H_W$ along the hard axis of a free layer within a MR element 254. That field is used in combination with a CPP current to set the final free layer orientation with respect to the pinned layer via spin momentum transfer. The concept in FIG. 13 can be extended by having two roughly orthogonal current carrying wires 262 and 264 that apply a magnetic field at a 45° angle with respect to the free layer hard axis of a CPP pillar 256, as shown in FIG. 14.

MRAM constructed in accordance with this invention include a word line that produces a field along the hard axis of a MR element in a similar manner to the half-select process described above. However, the bit lines are replaced and now a CPP current is applied to the MR element. This CPP current will produce a spin transfer torque acting on the FL that, depending on current direction, will orient the FL either parallel or anti-parallel to the PL.

One of the advantages of going to a hybrid write mechanism is illustrated in FIGS. 6 and 7. FIG. 6 illustrates the well-known reduction in the switching field of a single domain magnetic particle when a hard axis field is applied. FIG. 6 is simply another way of showing the data presented in FIG. 3. However, the same principle can also be applied to switching via spin momentum transfer. FIG. 7 shows actual experimental data from a CPP bottom spin valve structure in which an external hard axis magnetic field lowers the current induced switching thresholds between the low resistance parallel and high resistance anti-parallel states. The application of a hard axis field will therefore make switching via spin transfer more efficient and enable the switching of FL's exhibiting significantly larger anisotropy compared to the case where spin transfer is the sole physical write mechanism.

In addition to these gains in efficiency, the hard axis field will also lead to faster switching speeds than if spin transfer were to be used by itself. This is illustrated by the Landau-Lifshitz equation of motion:

$$\partial \vec{m}_{FL}/\partial t = -\gamma \vec{m}_{FL} \times [\vec{H}_{eff} + \alpha \vec{m}_{FL} \times \vec{H}_{eff}] + (\hbar j g/e) \vec{m}_{FL} \times \vec{m}_{FL} \times \vec{m}_{PL}, \quad (1)$$

where $\vec{m} = \vec{M}/M_s$ is the normalized magnetization, $\gamma$ is the gyromagnetic ratio, $\vec{H}_{eff}$ is the net magnetic field acting on the FL, $\alpha$ is the phenomenological damping coefficient, $\hbar$ is Planck's constant, $j$ is the electrical current density, $g$ is a factor related to the spin polarization of conduction electrons, and $e$ is the electron charge. The first two terms on the right hand side of Equation 1 are the usual precession and damping terms. The third term on the right is the torque due to spin transfer. A quick inspection of this last term reveals that the torque goes to zero when the FL and PL are either parallel or anti-parallel. In other words, spin transfer torque is smallest when the MR element in the MRAM cell is in its quiescent state. Switching the FL 180° from this quiescent state by spin transfer alone consequently takes a relatively long time for two predominant reasons. First, thermal fluctuations are necessary to produce small deflections of the FL magnetization away from being parallel or anti-parallel to the PL before the FL magnetization begins the switching process. Second, spin transfer torque is different in nature than the usual torque produced by a magnetic field such that it is necessary for the FL to undergo several precessional orbits around its initial direction before the magnetization rotates past 90° and into its new equilibrium direction. In contrast, the application of a hard axis field will deflect the FL into a state where there is a non-zero angle between the FL and PL magnetizations. Thus, the spin transfer torque produced by a CPP current will initially be large, thereby circumventing the long build up in angle required when spin transfer acts alone.

Therefore, a dc hard axis field can improve the efficiency and speed of switching via spin transfer. Further improvements can be made by exploiting the precessional overshoot of underdamped magnetic behavior, where the magnetization rotates around the equilibrium field direction largely set by the field from the word line. These improvements can be implemented by applying fast rise time current pulses through the word line that induces precession of the FL magnetization. The CPP current will then be synchronously applied at those instants when the FL magnetization overshoots its equilibrium configuration. The net result is that the FL can be switched using a smaller CPP current than that required when the magnetization has settled down into its static equilibrium direction.

Many different types of MR elements are compatible with the proposed write mechanism. The only major constraint is that electrical leads should be connected in such a way as to pass a CPP current through the pillar. Examples of three basic structures are shown in FIGS. 8, 9 and 10. FIG. 8 shows a basic CPP spin valve having three essential features of a PL, FL, and a non-magnetic spacer layer. FIG. 9 shows a CPP spin valve having a nano-oxide layer (NOL) in both the FL and PL, although a single NOL in either the FL or PL can also be used. The advantage of incorporating a NOL is that this increases the magnetoresistance, which will improve the power efficiency and amplitude of the read-back signal.

FIG. 10 shows a magnetic tunnel junction with an additional pinned reference layer. The read-back signal is determined by the magnetoresistance of the FL and PL on either side of the insulating tunnel barrier. The write process is determined by the spin transfer torque acting within the FL, the pinned reference layer, and the non-magnetic metallic spacer layer in between.

Note that the PL for all three examples is shown as a single layer of soft ferromagnetic material exchange biased by an antiferromagnet. However, other pinned layer structures can equally be applied, such as a synthetic antiferromagnet (SAF) pinned via exchange coupling to an antiferromagnet or permanent magnet, a single permanent magnet layer, or a soft ferromagnet exchange coupled to a permanent magnet. The pinned reference layer in FIG. 10 is shown as a single layer for clarity. As is the case for the PL, other structures can be equally applied. These include a SAF pinned via exchange coupling to an antiferromagnet or permanent magnet, a single layer of permanent magnet, or a soft ferromagnet exchange coupled to a permanent magnet or an antiferromagnet.

There is a wide latitude for the choice of materials and their thicknesses within the CPP stacks. Typical antiferromagnetic materials that can be readily used include IrMn, PtMn, PtPdMn, and NiMn. Permanent magnet materials can be CoPt, CoCrPt, FePt, or FePtCu. Examples of soft magnetic materials include Co, CoFe, NiFe, and their alloys. The nonmagnetic metallic spacers can be made from Cu, Ag, Au, or any other low resistance metal that efficiently transports spin polarized electrons from one ferromagnetic layer to another. Thicknesses of the layers are typically in the range of 1 to 15 nm.

The anisotropy of the free layer can be tuned in the usual manner using shape anisotropy, where a rectangular shape will promote uniaxial anisotropy that favors having the magnetization aligned along the long axis of the rectangle. The shape can be further refined by tapering the short sides of the rectangle into a point in order to promote single domain behavior in a now six-sided FL. Lastly, it is implicit in this disclosure that the PL is unperturbed by the fields from the current carrying wires. Only the FL magnetization will be significantly influenced by any magnetic field supplied by the word line.

The design shown in FIG. 4 can be simplified using a lead geometry illustrated in FIG. 11. In this simplified design, separate word lines are unnecessary as the electrical lead is wrapped around the MR element in such a way as to produce a hard axis field whenever a CPP current is applied to the device. The magnitude of the hard axis field is determined by the CPP current necessary to switch the FL via spin transfer and by the geometry of the lead. The hard axis field can be tuned by varying the separation between the lead and the MR element, or by adjusting the cross-sectional area of the lead in the region where it overlaps the MR element.

Another extension of the proposed design is presented in FIG. 13. FIG. 13 shows a top view of the basic elements necessary to implement the write process. However, the writing efficiency can be further improved by using two orthogonal word lines to lower the energy barrier for magnetization reversal, and then orient the FL into its intended direction using spin transfer torque. This concept is illustrated in FIG. 14. One word line applies a magnetic field along the hard axis while the second word line applies a field along the easy axis. The field from the second word line is reversible, depending on current direction, and is directed along the same direction in which the FL magnetization is to be set. In other words, the second word line increases the switching efficiency of the FL via spin transfer, which is confirmed by the experimental data shown in FIG. 7.

In general, the fields from the two word lines can have arbitrary values as long as the fields are below the reversal threshold. But, the advantage of writing with two word lines in combination with spin transfer is maximized for the particular case of equal field magnitudes shown in FIG. 14. This is because this writing scheme takes the fullest advantage of reducing the barrier height by applying a magnetic field. The energy barrier for magnetization reversal is dependent upon the magnitude and direction of a magnetic field. Larger fields obviously reduce the barrier more than smaller fields. But, for a given field amplitude, the energy barrier for magnetization reversal is maximum when the field is applied along the hard or easy axis and it is minimum (smaller by a factor of 2) when the field is applied 45° with respect to the anisotropy axis. For the example in FIG. 14, the field applied to the selected cell is oriented along the 45° direction. Moreover, the vector addition of the fields from the two word lines results in a net field that is a factor of 1.4 times larger than that of each individual word line. Hence, this writing scheme maximizes the writing efficiency of the selected cell and minimally impacts those cells along the two energized word lines.

The above examples have focused solely on the method of writing and on possible MR elements that can be used for such a method. In another aspect of the invention, the MR elements can be incorporated into various MRAM architectures beyond the specific example presented in FIG. 4.

Another important point is that MRAM typically also has some sort of series diode or transistor incorporated into each cell along with the MR element, the purpose of which is to properly direct the currents in the electrical circuitry during writing and read-back. These additional components have been omitted from the FIGs. for the sake of clarity, and it is an implicit assumption that the MRAM of this disclosure can incorporate whatever additional components are necessary to perform the write mechanism and to incorporate the MR elements into a system level architecture.

This invention provides a method of writing bits in a MRAM device that uses a combination of conventional magnetic field and spin momentum transfer. The magnetic field is produced by a current carrying wire in much the same way as conventional MRAM. However, the final direction of the bit is set by the spin transfer torque from a CPP current. Previous patents have proposed using only spin momentum transfer to write bits. In contrast, this invention overcomes the two issues of current efficiency and reversal speed by using a hybrid write mechanism. This invention improves the extensibility of MRAM to higher density and faster writing speeds.

While the invention has been described in term of several examples, it will be apparent to those skilled in the art that various changes can be made to the disclosed examples without departing from the scope of the invention as defined by the following claims.

The invention claimed is:

1. A method of writing to a magnetic random access memory comprising:
producing a magnetic field along a magnetically hard axis of a free layer of a magnetoresistive element; and
passing current through the magnetoresistive element to change a direction of magnetization of the free layer by spin momentum transfer.

2. The method of claim 1, wherein the step of producing a magnetic field along a magnetically hard axis of a free layer of a magnetoresistive element comprises:
passing a current through a first conductor located adjacent to the magnetoresistive element.

3. The method of claim 1, further comprising:
passing a current through a second conductor located adjacent to the magnetoresistive element, wherein the first and second conductors are not parallel with each other.

4. The method of claim 1, wherein the step of passing current through the magnetoresistive element to change a direction of magnetization of the free layer by spin momentum transfer comprises:
passing current through a first conductor connected to a first end of the magnetoresistive element; and
passing current through a second conductor connected to a second end of the magnetoresistive element;
wherein the first conductor serves as the means for producing a magnetic field along a magnetically hard axis of a free layer of a magnetoresistive element.

5. The method of claim 1, wherein the step of producing a magnetic field along a magnetically hard axis of a free layer of a magnetoresistive element comprises:
passing current through a first conductor having a first portion positioned adjacent to a first end of the magnetoresistive element and a second portion connected to a second end of the magnetoresistive element.

6. The method of claim 1, wherein the step of producing a magnetic field along a magnetically hard axis of a free layer of a magnetoresistive element causes the magnetization of the free layer to precess around an equilibrium direction; and
the current through the magnetoresistive element is applied at times when the magnetization of the free layer overshoots the equilibrium direction.

7. The method of claim 1, wherein the magnetoresistive element comprises:
a pinned layer; and
a nonmagnetic layer positioned between the free layer and the pinned layer.

8. The method of claim 7, wherein the magnetoresistive element further comprises:
a nano-oxide layer in either the free layer, the pinned layer, or both the free layer and a pinned layer.

9. The method of claim 1, wherein the magnetoresistive element comprises:
a first pinned layer;
a first nonmagnetic insulating tunnel barrier layer positioned between the free layer and the pinned layer;
a second pinned layer; and
a second nonmagnetic layer positioned between the free layer and the pinned layer.

10. A magnetic random access memory comprising:
means for producing a magnetic field along a magnetically hard axis of a free layer of a magnetoresistive element; and
means for passing current through the magnetoresistive element to change a direction of magnetization of the free layer by spin momentum transfer.

11. The magnetic random access memory of claim 10, wherein the means for producing a magnetic field along a magnetically hard axis of a free layer of a magnetoresistive element comprises:
   a first conductor positioned adjacent to the magnetoresistive element.

12. The magnetic random access memory of claim 11, further comprising:
   a second conductor positioned adjacent to the magnetoresistive element, wherein the first and second conductors are not parallel with each other.

13. The magnetic random access memory of claim 10, wherein means for passing current through the magnetoresistive element to change a direction of magnetization of the free layer by spin momentum transfer comprises:
   a first conductor connected to a first end of the magnetoresistive element; and
   a second conductor connected to a second end of the magnetoresistive element;
   wherein the first conductor serves as the means for producing a magnetic field along a magnetically hard axis of a free layer of a magnetoresistive element.

14. The magnetic random access memory of claim 10, wherein the means for producing a magnetic field along a magnetically hard axis of a free layer of a magnetoresistive element comprises:
   a first conductor having a first portion positioned adjacent to a first end of the magnetoresistive element and a second portion connected to a second end of the magnetoresistive element.

15. The magnetic random access memory of claim 10, wherein the magnetoresistive element comprises:
   a pinned layer; and
   a nonmagnetic layer positioned between the free layer and the pinned layer.

16. The magnetic random access memory of claim 15, wherein the pinned layer comprises one of: a single layer of soft ferromagnetic material exchange biased by an antiferromagnet; a synthetic antiferromagnet pinned by exchange coupling to an antiferromagnet or permanent magnet; a single permanent magnet layer; or a soft ferromagnet exchange coupled to a permanent magnet.

17. The magnetic random access memory of claim 15, further comprising:
   a nano-oxide layer in either the free layer, the pinned layer, or both the free layer and a pinned layer.

18. The magnetic random access memory of claim 10, wherein the magnetoresistive element comprises:
   a first pinned layer;
   a first nonmagnetic layer positioned between the free layer and the pinned layer;
   a second pinned layer; and
   a second nonmagnetic layer positioned between the free layer and the pinned layer.

19. The magnetic random access memory of claim 10, further comprising;
   means for connecting the magnetoresistive element to a current source.

20. The magnetic random access memory of claim 11, wherein the first conductor includes a tapered region.

* * * * *